(12) United States Patent
Kobayashi et al.

(10) Patent No.: US 6,955,942 B2
(45) Date of Patent: Oct. 18, 2005

(54) METHOD FOR MANUFACTURING CIRCUIT DEVICE

(75) Inventors: Yoshiyuki Kobayashi, Gunma (JP); Noriaki Sakamoto, Gunma (JP); Kouji Takahashi, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 49 days.

(21) Appl. No.: 10/196,087

(22) Filed: Jul. 16, 2002

(65) Prior Publication Data

US 2003/0017645 A1 Jan. 23, 2003

(30) Foreign Application Priority Data

Jul. 17, 2001 (JP) .................................... P. 2001-216245

(51) Int. Cl.$^7$ ............................................. H01L 21/44
(52) U.S. Cl. ................... 438/106; 438/613; 438/123
(58) Field of Search ....................... 438/106, 108, 438/613, 110, 111, 15, 123, 125, 126; 257/666, 667, 670

(56) References Cited

U.S. PATENT DOCUMENTS

2001/0045625 A1 * 11/2001 Sakamoto et al. .......... 257/666

FOREIGN PATENT DOCUMENTS

| JP | 9092769 | * 4/1997 |
| JP | 2002009443 | * 6/2000 |
| JP | 2002-76238 | 3/2002 |

* cited by examiner

*Primary Examiner*—Carl Whitehead, Jr.
*Assistant Examiner*—Yennhu B. Huynh
(74) *Attorney, Agent, or Firm*—Fish & Richardson, PC

(57) ABSTRACT

In a step of covering a rear face resist, by recognizing position of a positioning mark exposed at a rear face of a conductive foil, position recognition of a conductive pattern of the rear face of every block or every conductive foil is performed indirectly, and a resist layer is formed except an opening portion forming the scheduled rear face electrode on the conductive pattern. Therefore, a method of manufacturing a circuit device shortened in time.

31 Claims, 18 Drawing Sheets

METHOD FOR MANUFACTURING CIRCUIT DEVICE

CROSS-REFERENCE TO RELATED APPLICATIONS

This application claims priority under 35 USC §119 from Japanese Application No. 2001-216245 filed on Jul. 17, 2001.

BACKGROUND OF THE INVENTION

The present invention relates to a method of manufacturing a circuit device, particularly to a method of manufacturing a circuit device of thin type not needing a supporting substrate.

Up to now, since a circuit device set to an electronic instrument is used for a portable telephone, a portable computer, and the like, miniaturization, thin type, and light weight are required.

For example, describing an example of semiconductor device as a circuit device, there is a package type semiconductor device sealed with a usual transfer molding as a general semiconductor device up to now. The semiconductor device is molded on a printed circuit board PS as shown in FIG. 18.

In the package type semiconductor device, periphery of a semiconductor chip 2 is covered with a resin layer 3, and a lead terminal 4 for an external connection is led out from a side portion of the resin layer 3.

However, in the package type semiconductor device 1, the lead terminal 4 comes out from the resin layer 4, and size of the whole is too large to satisfy the request for miniaturization, thin type, and light weight.

Because of that, each company develops various kind of structure with competition to realize miniaturization, thin type, and light weight, and nowadays a wafer scale CSP similar in size as size of a chip, or a CSP some larger in size than the chip size, they are called CSP (chip size package), is developed.

FIG. 19 shows a CSP 6 adopting a glass epoxy substrate 5 as the supporting substrate and some larger than the chip size. Here, it is described as that a transistor chip T is molded on the glass epoxy substrate 5.

A first electrode 7, a second electrode 8, and die pad 9 are formed at the front face of the glass epoxy 5, and the rear face, a first rear face electrode 10 and a second rear face electrode 11 are formed. The first electrode 7 and the first rear face electrode 10, and the second electrode 8 and the second rear face electrode 11 are connected electrically through through-holes TH. The bare transistor chip T is fixed at the die pad 9, the emitter electrode of the transistor chip T and the first electrode 7 are connected through a metal fine wire 12, and the base electrode of the transistor chip T and the second electrode 8 are connected through a metal fine wire 12. Further, the resin layer 13 is provided on the glass epoxy substrate 5 so as to cover the transistor chip T.

The CSP 6 has merits that extending structure from the chip T to the rear face electrodes 10 and 11 for external connection is simple and it is produced in low cost differing from the wafer scale CSP though the glass epoxy substrate 5 is adopted.

Further, the CSP 6 is mounted on the printed circuit board PS as shown in FIG. 18. On the printed circuit board PS, electrodes and wiring forming an electric circuit are provided, and the CSP 6, the package type semiconductor device 1, chip resistors CR, or chip capacitors CC are connected electrically and fixed.

The circuit constructed by the printed circuit board is attached in various kinds of sets.

Next, a method of manufacturing the CSP will be described referring FIGS. 20A to 20D and FIG. 21.

First, the glass epoxy substrate 5 is provided for a base material (supporting substrate), Cu foils 20 and 21 are pressure bonded to both faces of the substrate through insulating adhesive. (See FIG. 20A)

Next, resist 22 having etching resistance property is covered on the Cu foils 20 and 21 corresponding to the first electrode 7, the second electrode 8, die pad 9, the first rear face electrode 10, and the second rear face electrode 11, and patterning the Cu foils 20 and 21 are performed. The patterning may be performed separately at front and rear faces. (See FIG. 20B)

Next, holes for the through-holes TH are formed at the epoxy substrate using drill and laser, and the through-holes TH are formed by plating the holes. By the through-holes, the first electrode 7 and the first rear face electrode 10, and the second electrode 8 and the second rear face electrode 10 are connected electrically. (See FIG. 20C)

Further, although not shown in the figures, Au plating is performed to the first electrode 7 and the second electrode 8 to be bonding posts, Au plating is performed to the die-pad becoming die-bonding post, and the transistor chip is die-bonded.

Finally, the emitter electrode of the transistor chip T and the first electrode 7, and the base electrode of the transistor chip T and the second electrode 8 are connected through the metal fine wires 12, and covered with the resin layer 13. (See FIG. 20D)

By the above method of manufacturing, electric elements of CSP type adopting the supporting substrate 5 are completed. The method of manufacturing is similar as by adopting a flexible sheet as a supporting substrate.

Although the transistor chip T, the connecting member (the first electrode 7, the second electrode 8, the die pad 9, the first rear face electrode 10, the second rear face electrode 11, and metal fine wire 12) and the resin layer 13 are required component elements on connecting to the outside and protecting the transistor in FIG. 18, it is difficult to provide circuit elements realizing miniaturization, thin shape, and light weight with such the component elements.

The glass epoxy substrate 5 being the supporting substrate is needless originally as described above. However, on the method of manufacturing, the substrate is adopted as a supporting substrate to bond the electrodes, so it is not possible to remove the glass epoxy substrate 5.

Because of that, by adopting the glass epoxy substrate 5, cost rises, further because the glass epoxy substrate 5 is thick, the circuit elements become thick so that there is a limit for miniaturization, thin shape, and light weight.

Further, through-hole forming process connecting electrode of both faces is always indispensable at the glass epoxy substrate and ceramic substrate, and there is a problem not fitting to mass production because manufacturing process becomes long.

In the view of the above problems, the applicant developed a circuit device making the supporting substrate needless in Japanese Patent Publication No. 2002-76238. However, position recognition of conductive pattern is performed at every mounting portion to form an opening for soldering electrode in the process covering the rear face resist so that there is a problem that it takes long time to recognize the position.

SUMMARY OF THE INVENTION

The invention is carried out in view of many above-mentioned problems, and the method of manufacturing a circuit device of the present invention comprises: a process preparing a conductive foil, forming a shallower isolation trench than thickness of the conductive foil at area except a conductive pattern scheduled to form and at area corresponding to a positioning mark scheduled to form; a process fixing a circuit element to the each mounting portion of the desired conductive pattern; a process connecting electrically an electrode of the circuit element of each mounting portion and the desired conductive pattern; a process covering the circuit element of each mounting portion in a lump, common-molding with insulation resin so as to fill into the isolation trench, and the same time filling the insulating resin into the confirmation hole too; and a process removing whole rear face area of the conductive foil till the insulating resin exposes, and by performing position confirmation using the positioning mark generating at the rear face.

In the invention, the conductive foil forming the conducting pattern is a starting material, the conductive foil has supporting function till the insulating resin is molded, after molding the supporting substrate is needless by that the insulating resin has supporting function so as to solve the problems of the related art. Here, the positioning mark means a part of the conductive foil exposed at the rear face of the insulating resin.

The invention is carried out in view of the above-mentioned many problems, and the method of manufacturing a circuit device of the present invention comprises: a process preparing a conductive foil; forming a shallower isolation trench than thickness of the conductive foil at area except the conductive pattern scheduled to form and at area except a positioning mark scheduled to form; a process fixing a circuit element at the each mounting portion of the desired conductive pattern; a process connecting electrically an electrode of the circuit element of each mounting portion and the desired conductive pattern; a process covering the circuit element of each mounting portion in a lump, common-molding with insulation resin so as to fill into the isolation trench, and the same time filling the insulating resin into the confirmation hole too; and a process removing whole rear face area of the conductive foil till the insulating resin exposes, wherein the position confirmation is performed using the positioning mark generating at the rear face by removing the conductive foil. Here, the position confirming mark means a part of the insulating resin exposed at the rear face of the conductive foil.

Further, in the method of manufacturing the circuit device of the invention is characterized in that position of the conductive pattern of the rear face is recognized indirectly by using the positioning mark, and that a resist layer is covered except an opening portion for forming a scheduled rear face electrode on the conductive pattern.

Moreover, the method of manufacturing the circuit device of the invention has a process forming a rear face electrode bonding conductive member at the opening portion of the resist layer.

Further, the method of manufacturing the circuit device of the invention recognizes the position of the conductive pattern of the rear face indirectly indirectly using the positioning mark and by dicing.

Furthermore, the method of manufacturing the circuit device of the invention recognizes the position of the electrode of the rear face indirectly by the positioning mark and by testing property of the circuit element.

Further, in the method of manufacturing the circuit device of the invention, the conductive foil is constructed by any of copper, aluminum, and Fe—Ni as a main material.

Moreover, the method of manufacturing the circuit device of the invention covers surface of the conductive foil by conductive film at least partly.

Further, the method of manufacturing the circuit device of the invention forms the conductive film with nickel, gold, silver, or palladium plating.

Furthermore, according to the method of manufacturing the circuit device of the invention, the isolation trench formed at the conductive foil selectively is removed chemically or physically.

Further, in the method of manufacturing the circuit device of the invention, a semiconductor bare chip and/or a chip circuit part are fixed on the circuit element.

Furthermore, in the method of manufacturing the circuit device, the insulating resin is common-molded at every the block by transfer molding.

Moreover, according to the method of manufacturing the circuit device, plural blocks arranging a conductive pattern forming at least plural circuit elements in matrix shape are lined at the conductive foil.

Further, in the method of manufacturing the circuit device, the insulating resin is formed by transfer-molding the whole of the blocks of the conductive foil at the same time.

Furthermore, according to the method of manufacturing the circuit device, the positioning mark is the insulating resin exposed at the rear face of the conductive foil at outside of the block of the conductive foil.

Moreover, in the method of manufacturing the circuit device, the positioning mark is provided at periphery of the conductive foil.

Further, in the method of manufacturing the circuit device, the positioning mark is the insulating resin exposed at the rear face of the conductive foil at outside of the block of the conductive foil.

Furthermore, in the method of manufacturing the circuit device, the positioning mark is the insulating resin exposed at inside of the conductive foil exposed at the rear face of the conductive foil at inside of the block of the conductive foil.

Moreover, according to the method of manufacturing the circuit device, position confirmation of the conductive pattern exposed at the rear face of the insulating resin of the each block is performed by the positioning mark.

Further, in the method of manufacturing the circuit device, position confirmation of the conductive pattern exposed at the rear face of the insulating resin of the whole of the conductive foil is performed by the positioning mark.

DETAILED DESCRIPTION OF THE PREFERRED EMBODIMENT

First, a method of manufacturing a circuit device of the invention will be described in detail referring FIG. 1.

The invention is constructed by a process preparing a conductive foil, forming a shallower isolation trench than thickness of the conductive foil at area except a conductive pattern scheduled to form and at area corresponding to a positioning mark scheduled to form; a process fixing a circuit element to the each mounting portion of the desired conductive pattern; a process connecting electrically an electrode of the circuit element of each mounting portion and the desired conductive pattern; a process covering the circuit element of each mounting portion in a lump, common-molding with insulation resin so as to fill into the isolation trench, and the same time filling the insulating resin into the confirmation hole too; a process removing whole rear face area of the conductive foil till the insulating resin exposes; a process covering with a resist layer except an opening portion for forming the scheduled rear face electrode on the conductive pattern; a process forming the rear face electrode bonding brazing material at the opening portion of the resist layer; a process testing property of the circuit element of each mounting portion of the block at the state bonded at an adhesive sheet; and a process separating the insulating resin of the block at each mounting portion by dicing in the state bonded at the adhesive sheet.

Figure 1:
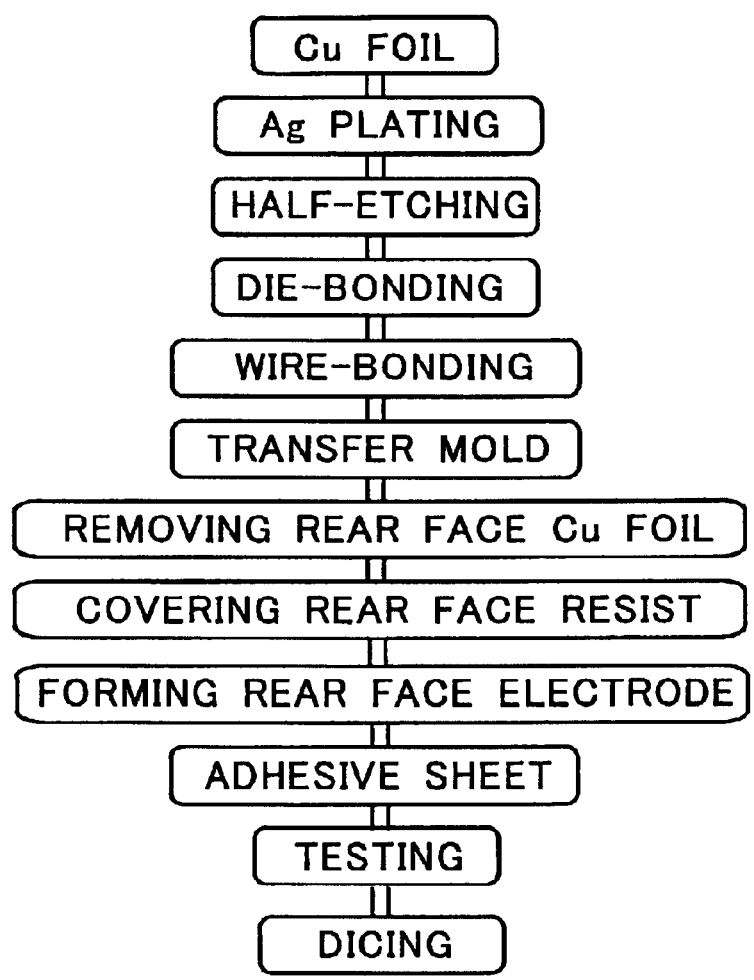
FIG. 1 is a view describing a product flow of the invention.

In the flowchart shown in FIG. 1, a conductive pattern is formed by three flows: a process providing a Cu foil first; a process performing Ag plating, and a process half-etching. Mounting the circuit elements on each mounting portion and connection between the electrodes of the circuit elements and the conductive pattern are performed by two processes of die bonding and wire-bonding. Common molding by insulating resin is performed at the process of transfer molding. The common molding member performing molding a block including plural mounting portions using one die cavity. In the process of removing rear face Cu foil, rear face of the conductive foil is etched until the insulating resin is exposed. In the process of the rear face resist, a resist layer is formed on the conductive pattern exposed on the rear face of the insulating resin. In the forming rear face electrode, a rear face electrode of the conductive pattern is formed by applying cream shaped brazing material and melting by heating. In the process of adhesive sheet, plural blocks are bonded at the adhesive sheet. In the process of testing, judge of quality and classing characteristic rank of the circuit elements attached in each circuit device portion are performed. In the process of dicing, separation to individual circuit device from the insulation resin by dicing.

Each process of the invention will be described below referring FIG. 2A to FIG. 17.

A first process of the invention is to form a conductive pattern 51 of every block 62 by providing a conductive foil 60, and by forming a shallower isolation trench 61 than thickness of the conductive foil 60 at the conductive foil 60 of area except a conductive pattern forming at least many mounting portions of a circuit element 52 and area corresponding to a positioning mark as shown in FIG. 2A to FIG. 4C.

Figure 2A:
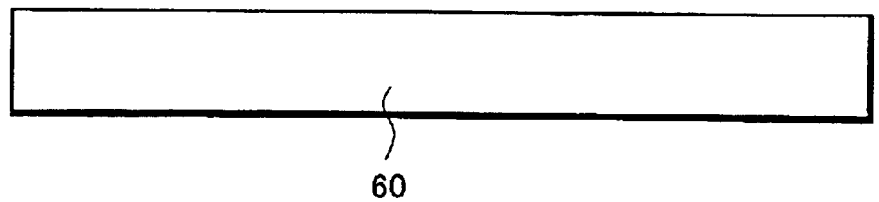
FIGS. 2A to 2B are views explaining a method of manufacturing a circuit device of the invention.

In the process, a sheet shaped conductive foil 60 is provided first as FIG. 2A. Material of the conductive foil 60 is selected in consideration of adhesion, bonding and plating qualities of brazing material, then, the conductive foil 60, conductive foil being Cu as a main material, conductive foil being Al as a main material, or conductive foil made of alloy of Fe—Ni is adopted.

Thickness of the conductive foil is desirable to be 10 μm to 300 μm considering the later etching, here Cu foil of 125 μm is adopted. However, the thickness may be more than 300 μm or less than 10 μm fundamentally. As described later, the isolation trench 61 shallower than thickness of the conductive foil 60 may be formed.

The sheet shaped conductive foil 60 may be provided wound in roll shape for example with 45 mm to transfer to each process described later, and the rectangular shaped conductive foil 60 cut in the predetermined size may be provided to transfer to each process described later.

Figure 2B:
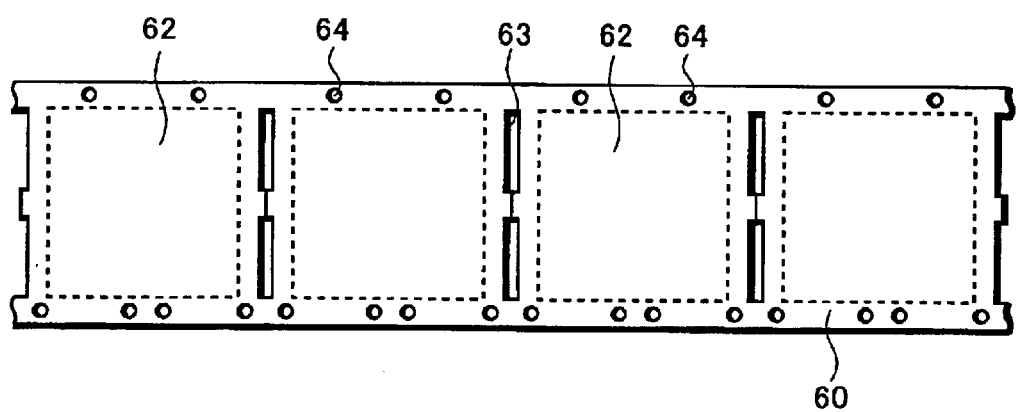

Concretely, four to five blocks 62 forming many mounting portions at the rectangle shaped conductive foil 60 are lined separately as shown in FIG. 2B. Slits 63 are provided between each block 62. The slits have a function absorbing stress of the conductive foil 60 generating at heating process in the molding process. Index holes 64 are provided at end portions of upper and lower sides of the conductive foil 60 with certain space to use for positioning at each process.

Continuously there is a process forming the conductive pattern 51 of every block.

Figure 3:
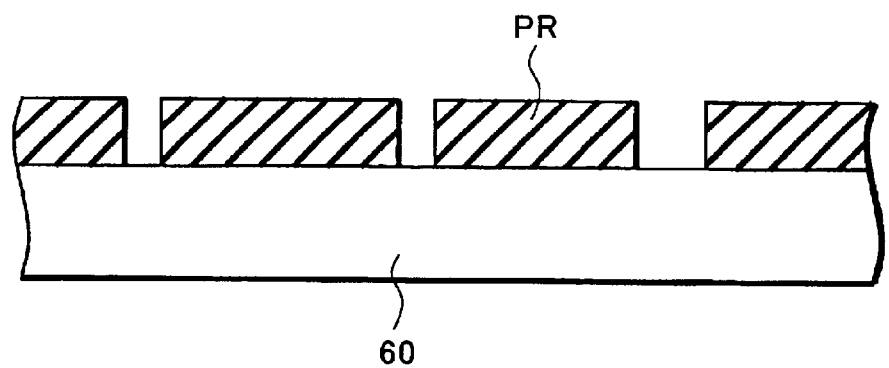
FIG. 3 is a view explaining a method of manufacturing a circuit device of the invention.
Figure 4A:
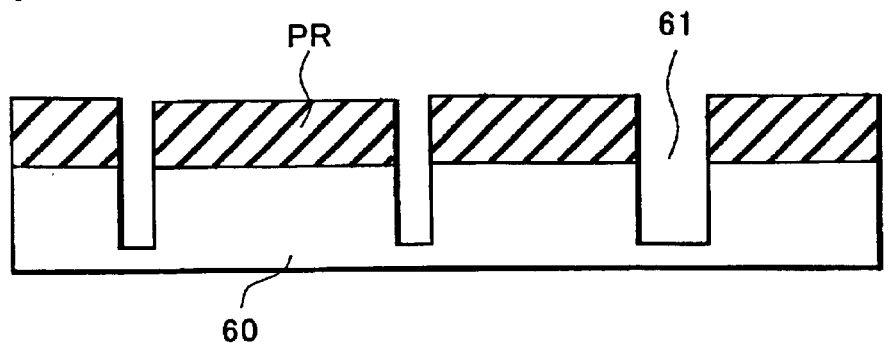
FIGS. 4A to 4C are views explaining a method of manufacturing a circuit device of the invention.

A photo resist (etching mask resistance) PR is formed on the Cu foil 60 first as shown in FIG. 3, and the photo resist PR is patterned so that the conductive foil 60 except area being the conductive pattern 51 is exposed. The conductive foil 60 is etched selectively through the photo resist PR as shown in FIG. 4A. Depth of the isolation trench 61 formed by etching is 50 μm for example, adhesion with the insulating resin 50 is improved because side face of the trench is rough face. Although the side wall of the isolation trench 61 is shown with straight line as a model, the construction differs by removing method of the removing process, wet etching, dry etching, evaporation by laser, and dicing are adopted. In the case of wet etching, ferric chloride or cupric chloride is mainly adopted for enchant, and the conductive foil is dipped in the etchant or showered by the etchant. Here, in the wet etching, the side face becomes bent structure because of character generally etched in non-anisotropy.

Further in the process, the photo resist is patterned so that a confirming hole 100 is formed outside of the block 62. In the invention, the confirming hole 100 is used to expose at the rear face of the conductive foil 60 in later process and to position at process forming an external electrode 56 at the rear face of each mounting portion 65. For the confirming hole 100, there are two methods of a first method adopting the insulating resin 50 exposed at the rear face of the conductive foil 60 and a second method adopting the conductive pattern exposed at the rear face of the insulation resin 50. Although the first method adopting the insulating resin 50 exposed at the rear face of the conductive foil 60 is described in the following description, the similar advantage is obtained even by the above-mentioned second method.

A conductive film (not shown) having corrosion resistance to etchant instead of photo resist may be covered selectively in FIG. 3. The conductive film becomes an etching protect film by covering a part selectively being conductive path, and the isolation trench can be etched without adopting resist. Material for the conductive film is Ag, Ni, Au, Pt, or Pd. These conductive films of corrosion resist have characteristic using it as die-pad and bonding pad.

For example, Ag film is bonded to Au and to brazing material too. Therefore, by covering Au film at the rear face, the chip is bonded by thermo-compression to Ag film on the conductive path 51, and the chip is fixed through brazing material of solder and the like. Since Au fine wire is bonded to Ag conductive film, wire bonding is possible. Therefore, the conductive film has merit being used as die pad and bonding pad as it is.

Figure 4B:
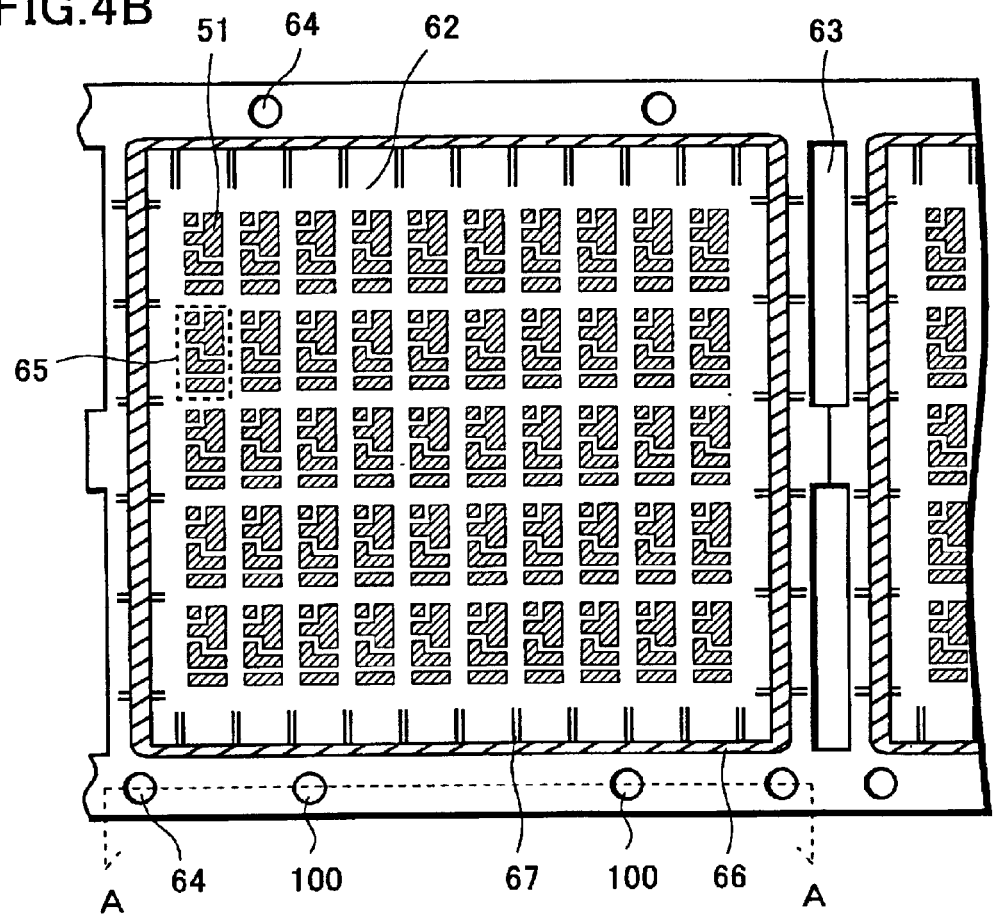

The concrete conductive pattern 51 is shown in FIG. 4(B) The figure corresponds to the pattern enlarging one of the blocks 62 shown in FIG. 2(B). One of hatched parts is one mounting portion 65, it constructs the conductive pattern 51, and many mounting portions 65 are arranged in matrix shape of 5 rows and 10 columns at one block 62 so as to provide the same conductive pattern 51 at every mounting portion 65. A frame shaped pattern 66 is provided, and positioning marks 67 at dicing are provided separately inside therefrom at periphery of each block. The frame shaped pattern 66 is used as a contacting part to a molding die, particularly an upper die.

The confirming holes 100 for position recognition used at covering the rear face resist are provided near the index hole 64 as shown in FIG. 4B.

Figure 4C:
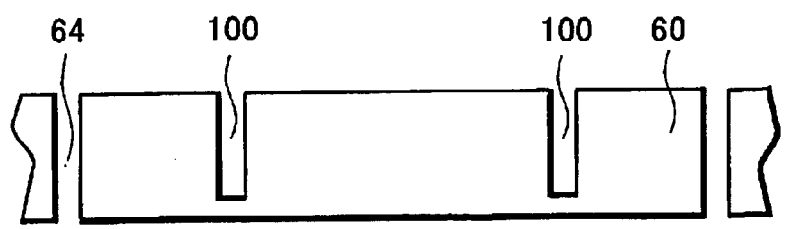
Figure 5:
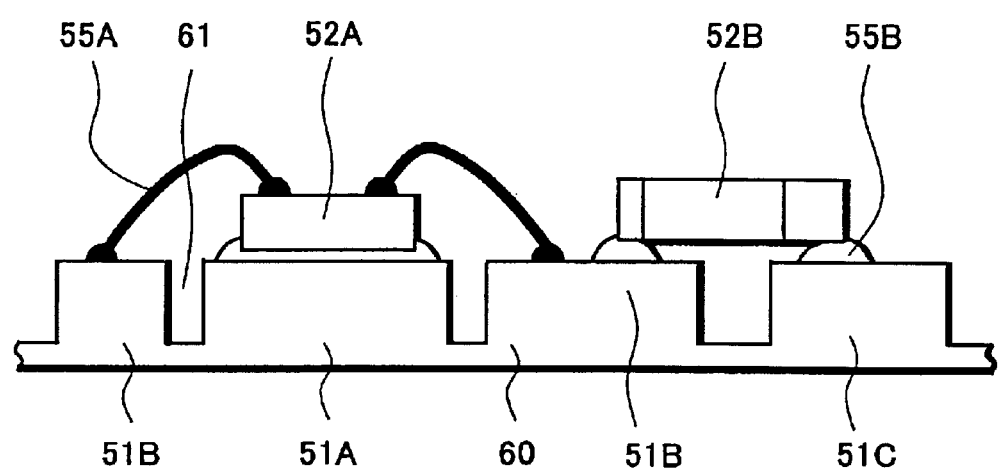
FIG. 5 is a view explaining a method of manufacturing a circuit device of the invention.

FIG. 4C is a sectional view cut by A—A line of FIG. 4B, the confirming holes are provided at the same time in forming the isolation trenches 61, have almost similar depth, and are used for position recognition of the conductive pattern of the rear face indirectly at the process of covering the rear face. The insulating resin 50 is filled in the confirming holes 100 at the later process, and the filled insulating resin 50 exposes from the rear face of the conductive foil 60 so as to use as a mark for positioning. There is a case that the conductive foil 60 exposed from the rear face of the insulating resin 50 is used as a mark for positioning. In this case, the trench is formed by etching the conductive foil 60 of the periphery of the area shown with symbol 100 in FIG. 4C.

A second process of the invention is to fix the circuit elements 52 at each mounting portion of the desired conductive pattern 51 and to form connecting member connecting electrodes of the circuit element 52 of each mounting portion 65 and the desired conductive pattern 51 electrically.

The circuit elements 52 are semiconductor element such as transistor, diode, IC chip, and passive elements such as chip capacitor, chip resistor, and the like. Semiconductor elements of facedown, further semiconductor package-processed such as CSP, BGA, and the like can be mounted.

Here, a bare transistor chip 52A is die-bonded at the conductive pattern 51A, and the emitter electrode and the conductive pattern 51B, the base electrode and the conductive pattern 51B are connected through metal fine wires 55A fixed with ball-bonding or wedge-bonding by ultrasonic waves. 52B is a chip capacitor or a passive element, and is fixed with brazing material 55B such as solder or conductive paste.

In the process, since many conductive patterns 51 are integrated at each block 62, there is an advantage performing very efficiently fixing and wire bonding of the circuit element 52.

A third process of the invention is to cover the circuit element 52 of each mounting portion 63 in a lump and to mold commonly with the insulating resin 50 so as to fill the isolation trench 61 as shown in FIG. 6.

Figure 6A:
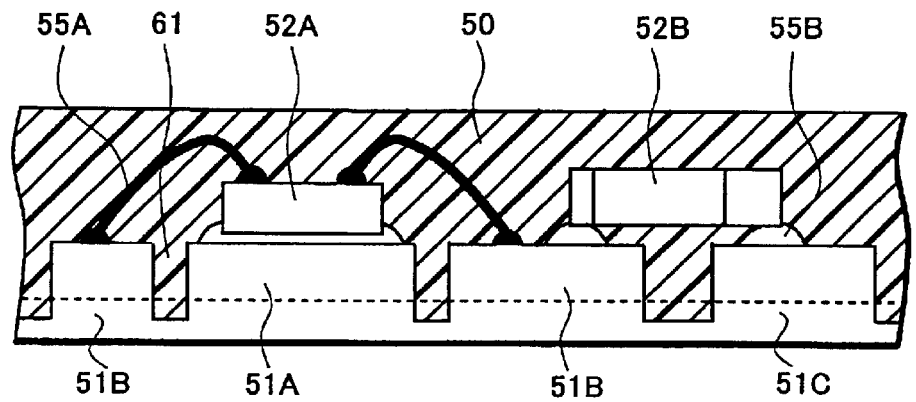
FIGS. 6A to 6C are views explaining a method of manufacturing a circuit device of the invention.

In the process, the insulating resin 50 covers circuit elements 52A and 52B, plural conductive patterns 51A, 51B, and 51C, and the isolation trench 61 between conductive patterns 51 is filled with the insulating resin 50 so that the resin bonds strongly fitting bent structure of side faces of the conductive patterns 51A, 51B, and 51C as shown in FIG. 6A. Then the conductive pattern 51 is supported by the insulating resin 50.

The process is realized by transfer molding, injection molding, or dipping. For resin material, thermosetting resin such as epoxy resin etc. is realized by transfer molding, thermoplastic resin such as polyimide resin, polyphenylene sulphite, and the like is realized by injecting molding.

Figure 6B:
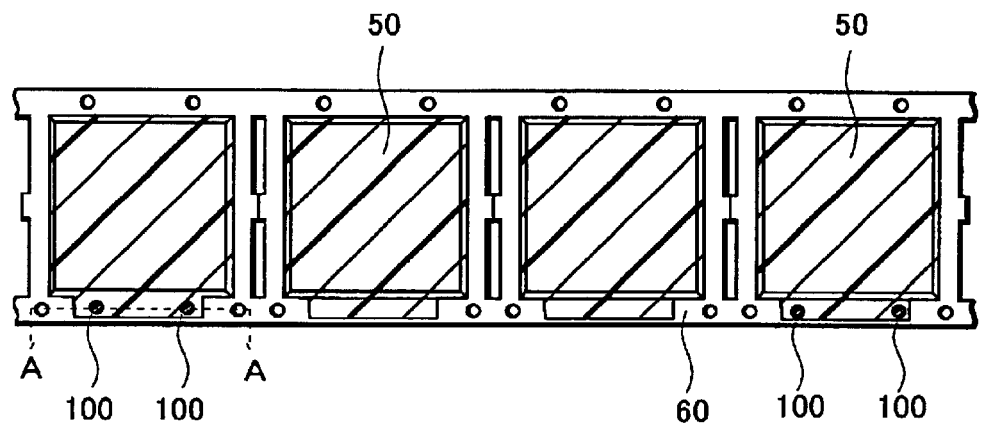

Further, at transfer molding or injecting molding in the process, molding is performed commonly at one cavity of the molding die with one insulating resin 50 at every block as shown in FIG. 6B. Therefore, each block 62 is molded at one time by one die, and sealing area is formed with the conductive pattern and the cavity of the upper die contacting at the bar shaped pattern 66. Because of that, it requires fewer number of runners than that in the conventional method where each mounting portion is individually molded, thereby individually quantity of resin being reduced sharply.

Further, in the process, since the molding die molds the block commonly not molding the individual mounting portion, the molding die can be used commonly regardless of kinds or size of the produced circuit element.

Thickness of the insulating resin 50 covered on surface of the conductive foil 60 is adjusted so as to cover about 100 $\mu$m from the top portion of the metal fine wire 55A of the circuit element 52. It is possible to make the thickness thick or thin.

Figure 19:
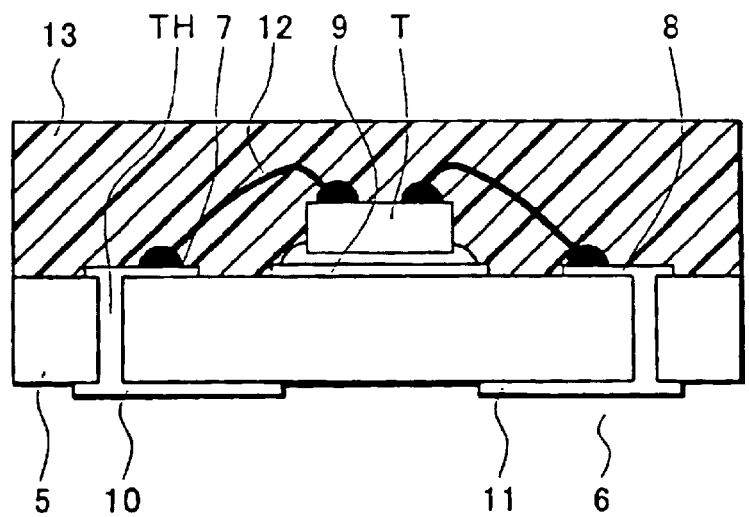
FIG. 19 is a view explaining the conventional circuit device.
Figure 20A:
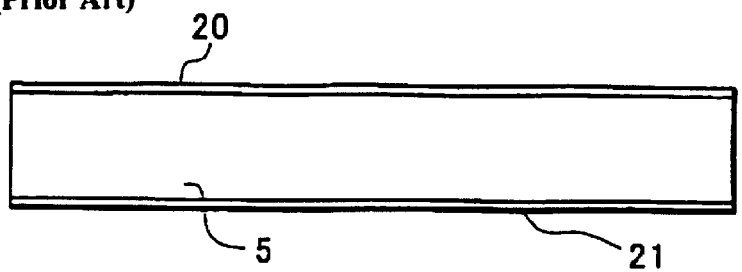
FIGS. 20A to 20D are views explaining the method of manufacturing the conventional circuit device.
Figure 20B:
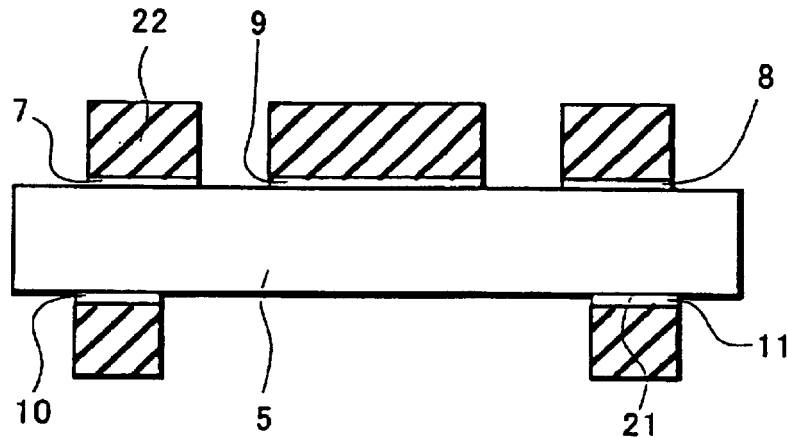
Figure 20C:
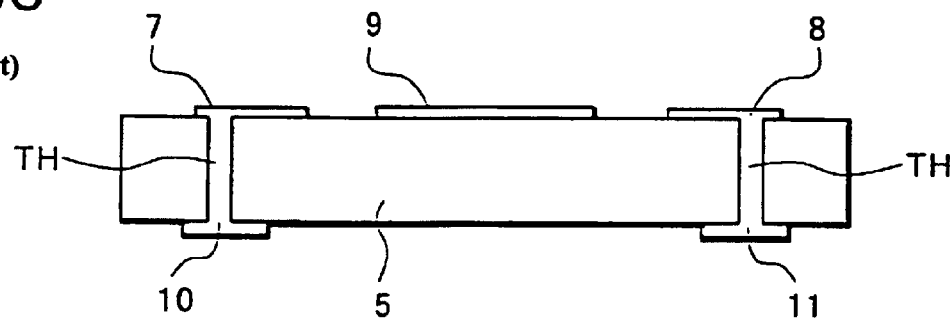
Figure 20D:
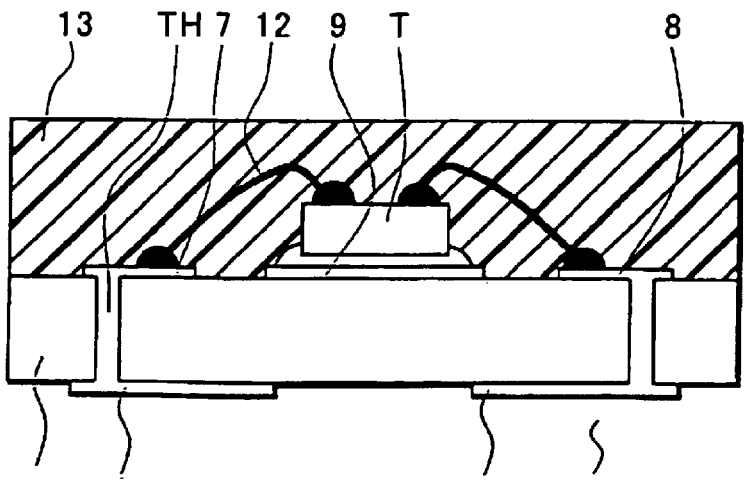
Figure 21:
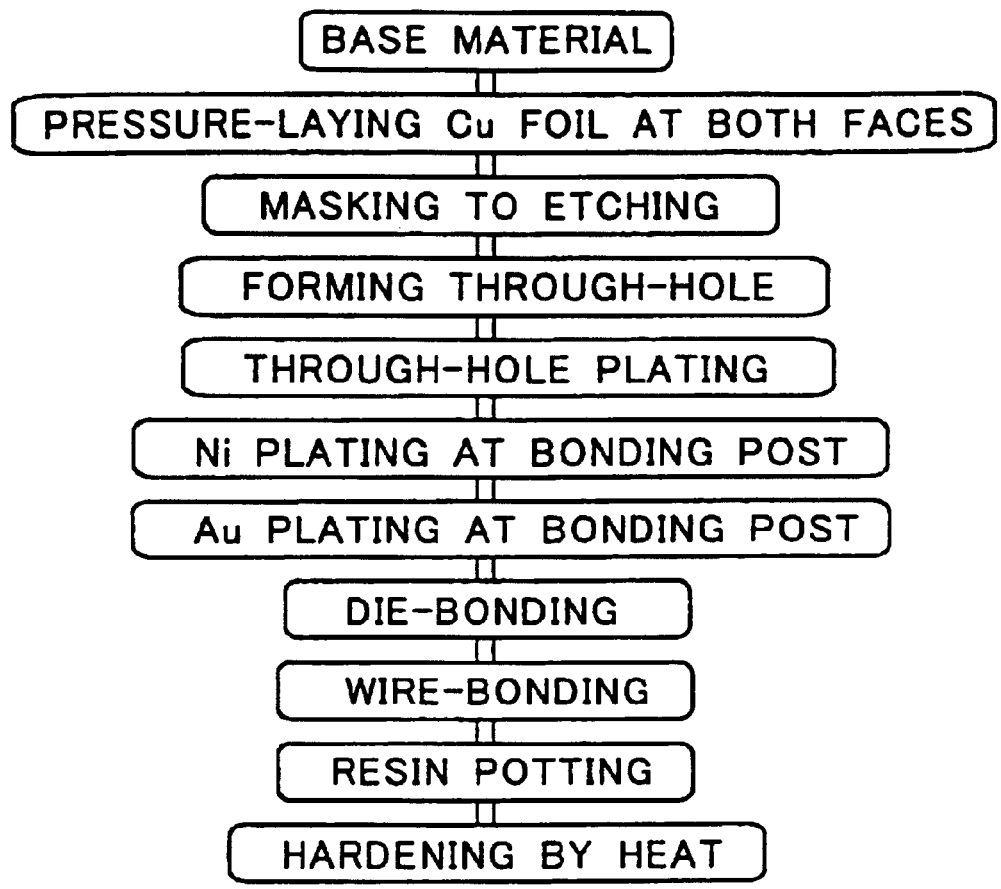
FIG. 21 is a view explaining the product flow of the conventional circuit device.

A feature of the process is that the conductive foil 60 becoming the conductive pattern 51 functions as a supporting substrate till the insulating resin 50 is covered. Although the conductive paths 7 to 11 are formed adopting the supporting substrate 5 needless originally up to now as shown in FIG. 19, the conductive foil 60 becoming the supporting substrate is material needing for electrode material in the invention. Because of that, the process has merit enabling to operate omitting component material as far as possible so as to realize cost reduction.

Since the isolation trench 61 is formed shallower than thickness of the conductive foil, the conductive foil 60 is not separated individually as the conductive pattern. Therefore, the conductive foil has a feature that it is treated in one body as the sheet shaped conductive foil 60 and that operation of transferring to the die and mounting to the die is very easy.

Since plural circuit elements are molded in a lump in the process, it is an important point that resin burr generating at molding the circuit element individually does not generate.

Figure 6C:
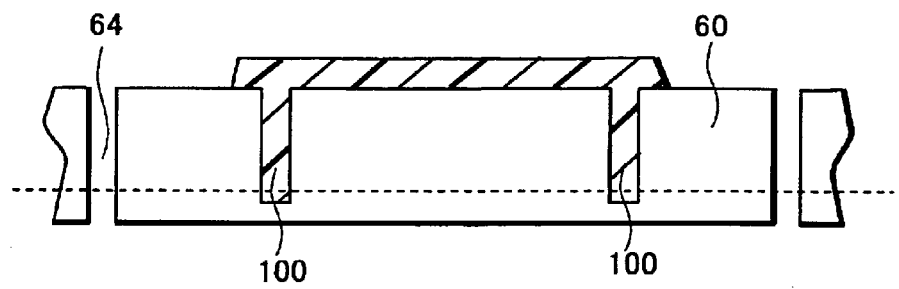

FIG. 6C is a sectional view cut by A—A line of FIG. 6B, the confirming hole 100 too is molded, and the insulation resin 50 is filled at the process. Then, by removing the conductive foil 60 of lower part to the dotted line of the figure, the insulating resin 50 is exposed from the conductive foil 60. The exposed insulating resin 50 is used for positioning indirectly at the process forming the external electrode 56. Further, in the case using the conductive foil 60 is exposed from the insulating resin 50, the insulating resin 50 is filled in the trench formed at the periphery portion of the area shown with symbol 100.

Figure 7A:
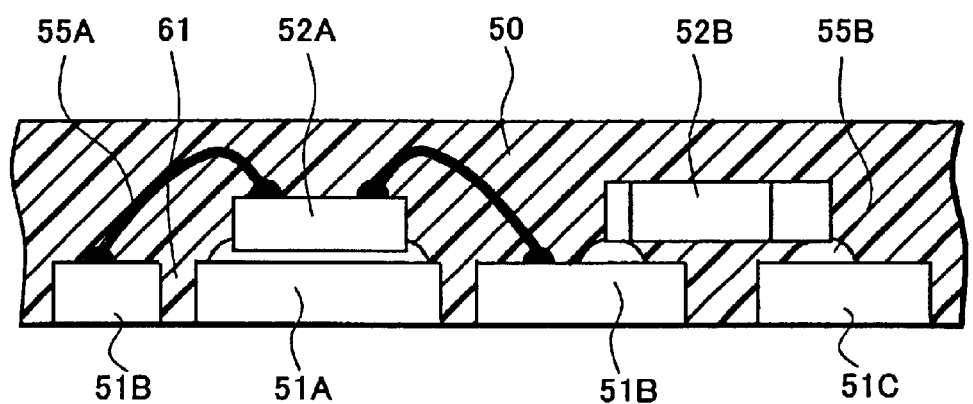
FIGS. 7A and 7B are views explaining a method of manufacturing a circuit device of the invention.
Figure 7B:
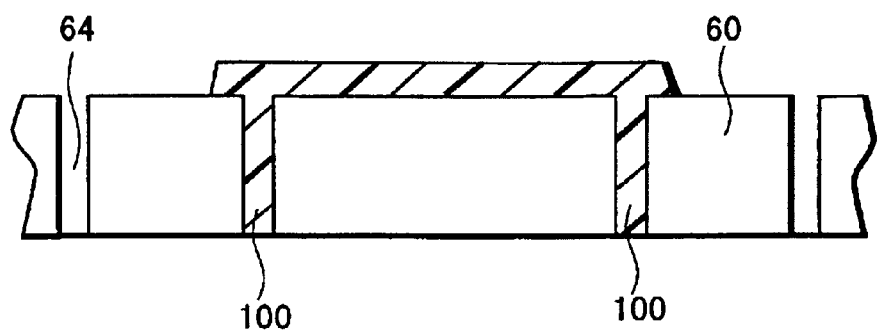

A fourth process of the invention is to remove whole area of rear face of the conductive foil 60 until the insulating resin is exposed as shown in FIGS. 7A and 7B.

The process is to remove the entire rear face of the conductive foil 60 chemically and/or physically and separate as the conductive pattern 51. The process is performed by polishing, grinding, etching, metal evaporation of laser, and the like.

At experiment, the entire face of the conductive foil 60 is wet-etched so as to expose the insulating resin 50 to the isolation trench 61. As the result, the conductive foil is separated becoming the conductive pattern 51 of about 40 μm thickness.

Further, as shown in FIG. 7B, the insulating resin 50 filled into the confirming hole 100 has a structure exposing at the process, and at the process covering the rear face resist, the structure is used for performing indirectly position recognition of the conductive pattern 51 of the rear face as the positioning mark 101. In the case that the conductive foil 60 exposed from the rear face of the insulating resin 50 is used for the positioning mark, the insulating resin 50 is filled into the trench provided so as to surround the part shown with symbol 100. Then, by removing the entire rear face of the conductive foil 60, the conductive foil 60 exposes from the insulating resin 50 filled in the trench.

A fifth process of the invention is to cover a resist layer 90 on the conductive pattern 51 exposed at the rear face of the insulating resin 50 of the conductive foil 60 and to form an opening 92 so as to expose the scheduled rear face electrode 56 as shown in FIG. 8A to FIG. 11.

Figure 8A:
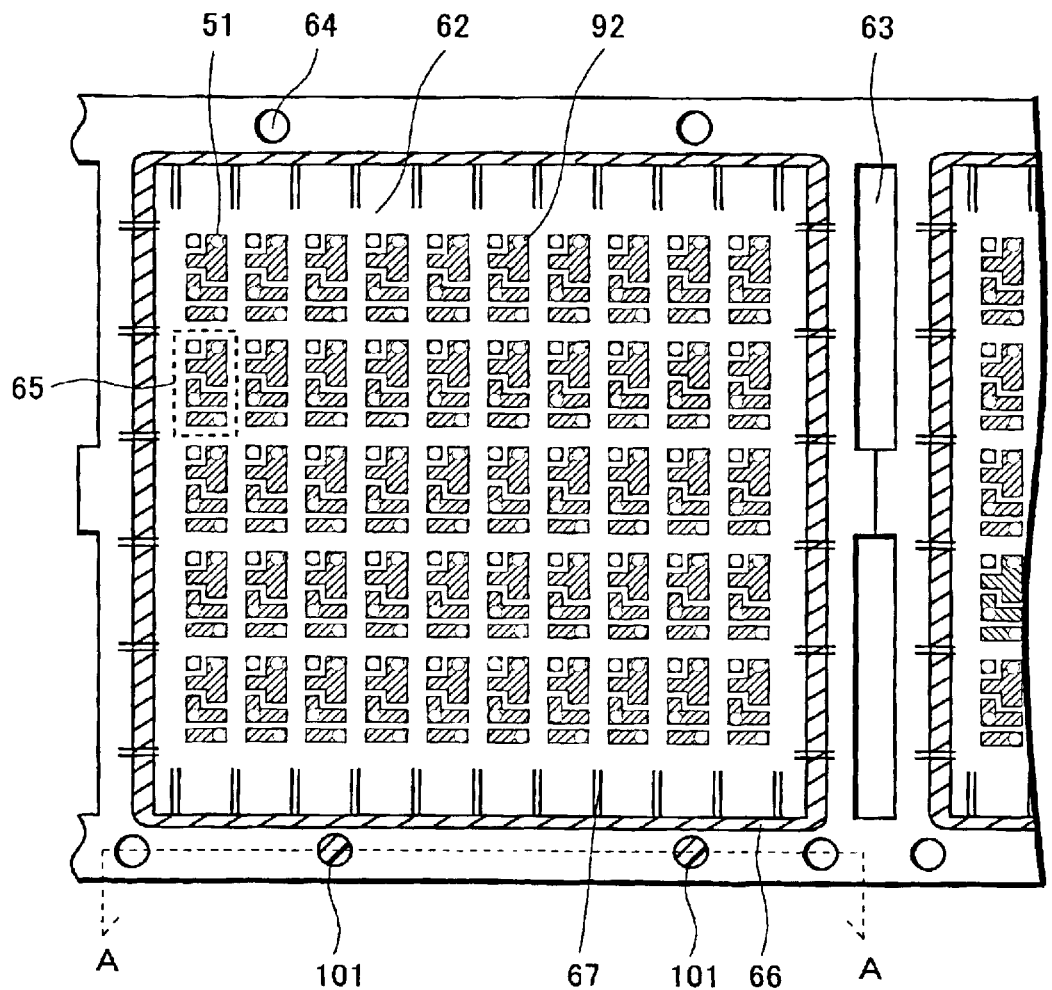
FIGS. 8A to 8C are views explaining a method of manufacturing a circuit device of the invention.

In FIG. 8A, hatched parts shows the conductive patterns 51 and outline circles on hatched background shows the opening portions 92 of the rear face resist. However, actually the rear face of the block 62 except the opening portion 92 of the rear resist is covered by the resist layer 90.

At the process, position recognition of the conductive pattern 51 exposed at the rear face is performed indirectly by the positioning mark 101 as shown in FIG. 8A, and the resist layer 90 is covered except the opening portion 92 forming the scheduled rear face electrode 56.

Here, it is considered that a guide hole 64 is adopted for the mark recognizing the conductive pattern exposed at the rear face. However, since whole rear face of the conductive foil 60 is etched at the process removing the rear face Cu foil, inner wall of the guide hole 64 is etched so as to generate error at the diameter or the position. Therefore, the guide hole 64 can not used for position recognition of the conductive foil exposed at the rear face. By that, the insulating resin 101 exposed at the periphery portion of the rear face of the conductive foil is adopted for the position recognition mark.

Figure 8B:
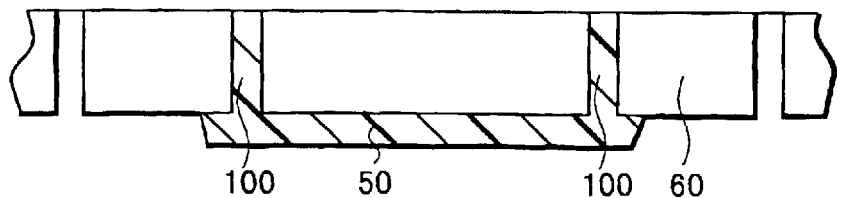

Since the positioning mark 101 is the insulating resin filled in the confirming hole 100 formed by the same technique as the isolation trench 61 of the mounding portion 65, the mark is exposed at the rear face in the process removing the rear face Cu foil as shown in FIG. 8B. Although the positioning mark 101 is circle shape in the process, any shape enabling to recognize with position recognizing camera may be used except shape of circle.

Figure 8C:
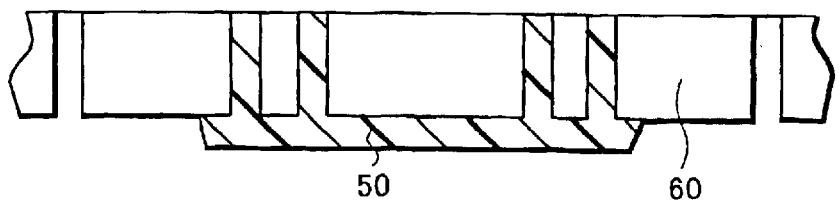

Further, it is possible to use the conductive foil 60 exposed from the insulating resin 50 for the positioning mark as shown in FIG. 8C. In this case, the area shown with symbol 100 becomes the conductive foil 60, and the insulating resin 50 exposes so as to surround the area shown with symbol 100 in FIG. 8A.

Concrete technique of the process will be described below. First, the resist layer is covered by performing screen-printing, roll coater, or electrostatic apply to the entire rear face of each block 62 of the conductive foil 60. By that, since the conductive pattern 51 is covered entirely by the resist layer 90 and the resist layer 90 is not transparent, it is difficult to position-recognize the conductive pattern 51 directly.

Continuously, position recognition of the conductive pattern 51 is performed. Since the positioning mark 101 is exposed at the rear face of remained portion of periphery of the conductive foil 60 not forming the conductive pattern 51 as shown in FIG. 8A, covering by the resist layer 90 is not performed as shown in FIG. 8B. Since insulating resin being material of the positioning mark 101 and material Cu of the conductive foil 60 are largely different in reflectance of light, distinction of outline of the positioning mark 101 is performed clearly. Further, the conductive foil 60 is high in dimension accuracy comparing with ceramic substrate and the like. Therefore, by recognizing the position of the positioning mark 101 exactly, the position of the conductive pattern 51 of every block or every conductive foil can be recognized indirectly.

Figure 9A:
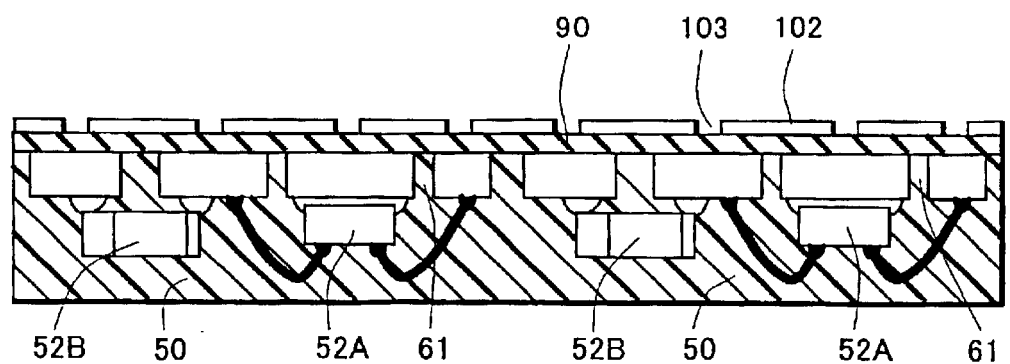
FIGS. 9A and 9B are views explaining a method of manufacturing a circuit device of the invention.
Figure 9B:
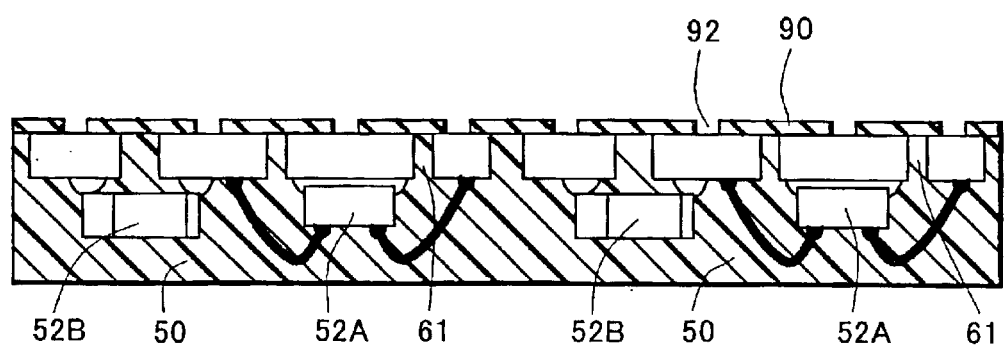

Continuously, a photo resist 102 is formed except upper part of the opening portion 92 forming the scheduled rear face electrode 56 as shown in FIG. 9A. The opening portion 92 is formed by etching the resist layer 90 covered selectively by the photo resist 102 as shown in FIG. 9B. The resist layer 90 protects the conductive pattern 51 from oxidation or contamination, and determines the size of the rear face electrode 56 formed.

In the case that material of the resist layer 90 is photosensitive, the photo resist 102 is needless.

Since covering the rear face resist of every block or every conductive foil is performed continuously by one time position recognition in the process, the above-mentioned process can form the rear face resist shortened in time.

Figure 10:
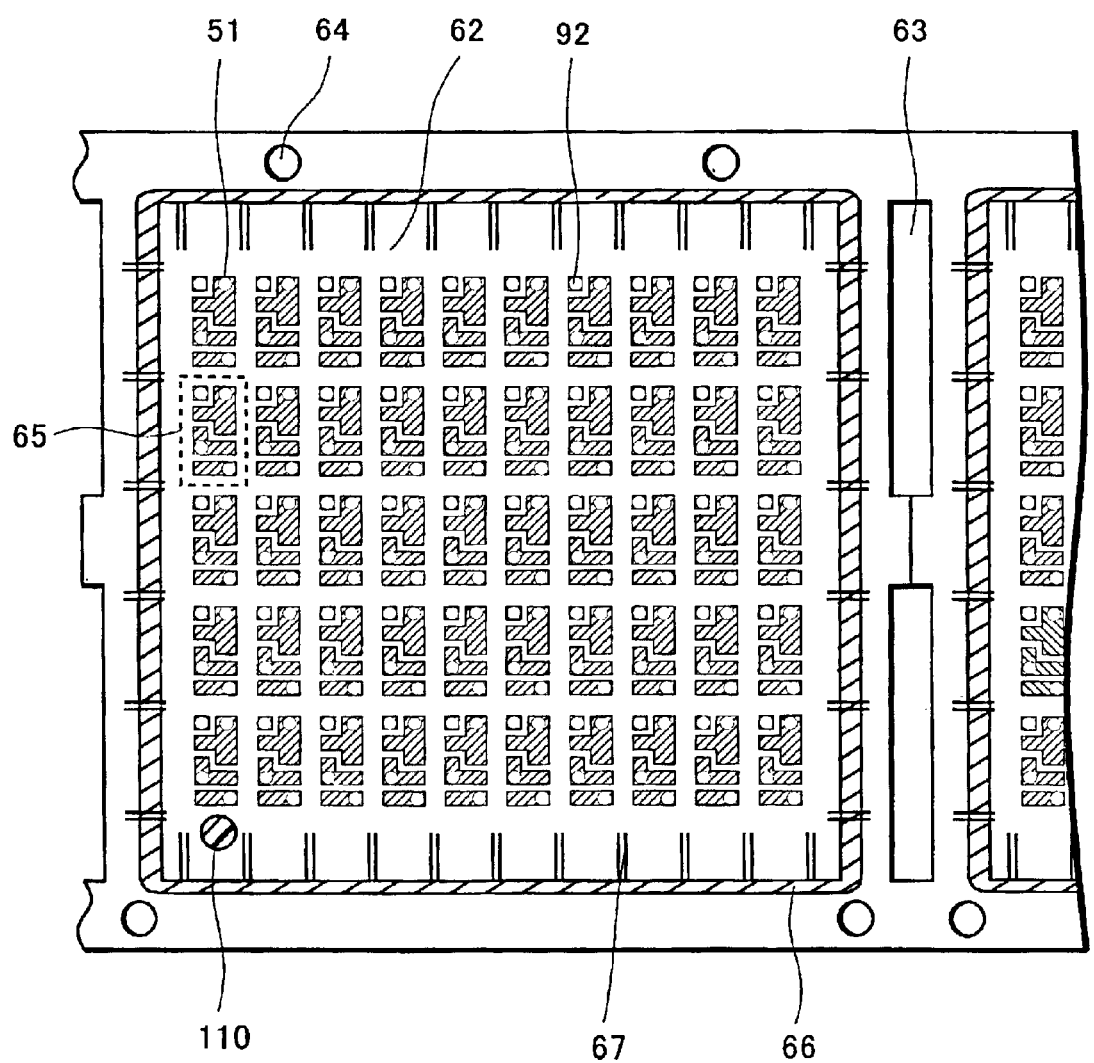
FIG. 10 is a view explaining a method of manufacturing a circuit device of the invention.

In the description of the above-mentioned process, position recognition of the conductive pattern exposed at the rear face is performed using the insulation resin 101 exposed at the rear face of outside of the conductive foil as a positioning mark. However, there is a method using a conductive foil 110 exposed at the rear face of the insulating resin where the conductive pattern is not provided in the block for the positioning mark as shown in FIG. 10.

Figure 11:
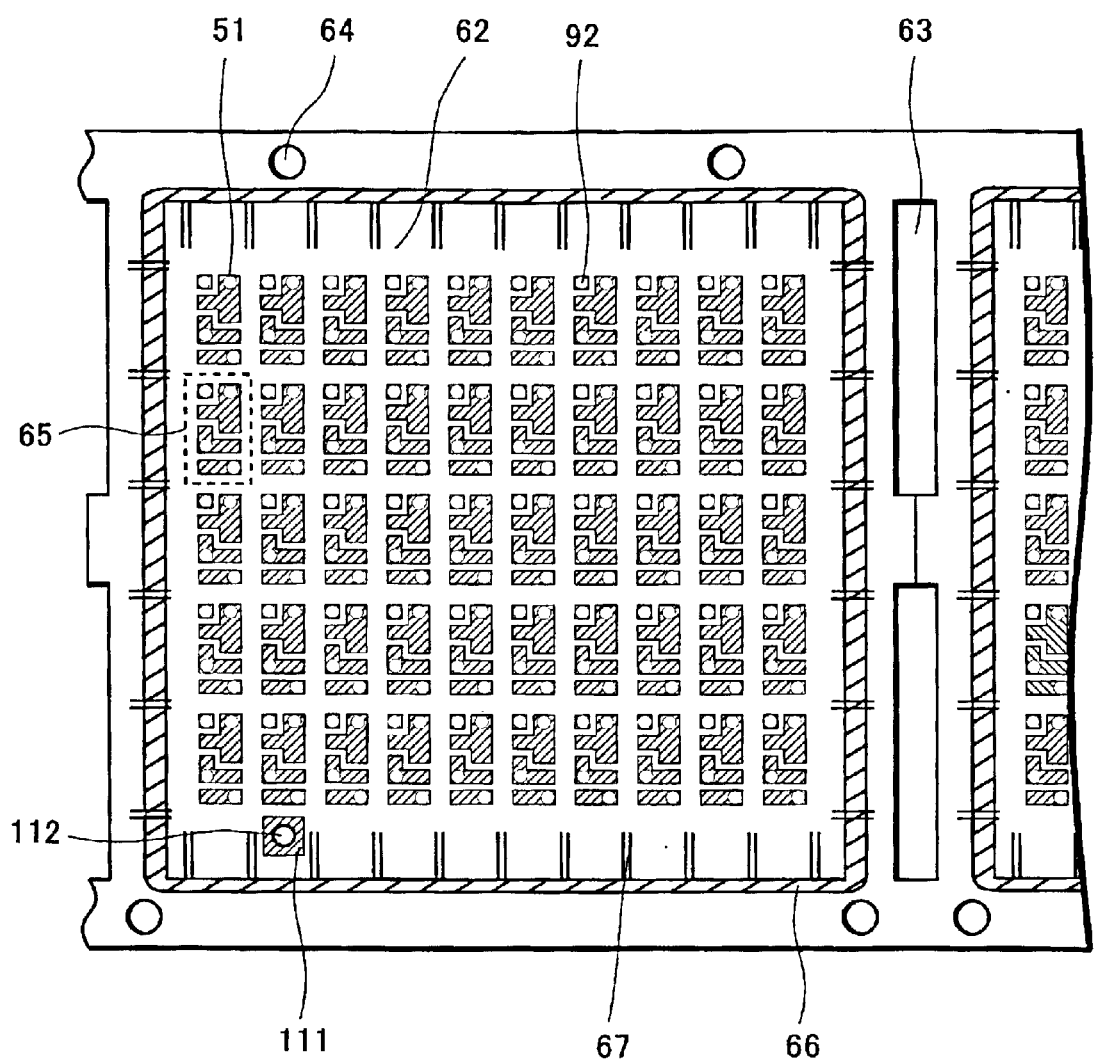
FIG. 11 is a view explaining a method of manufacturing a circuit device of the invention.

Further, there is a method using a conductive foil 112 exposed at the inside of a conductive foil 111 exposed at the rear face of the insulating resin where the conductive pattern is not provided in the block for the positioning mark as shown in FIG. 11.

The position of the conductive pattern exposed at the rear face by is recognized as the positioning mark to form an opening portion for solder electrode in the invention. However, in the case the positioning mark is provided inside of the block, indirect position recognition of the conductive foil or solder electrode can be performed at the later process using this. For example, in the testing property, the test is performed after position recognition of the entire rear face electrode in the block 62 by the positioning mark. Further, in the dicing process, dicing is performed after position recognition of the entire rear face electrode 56 in the block 62 by the positioning mark.

Figure 12A:
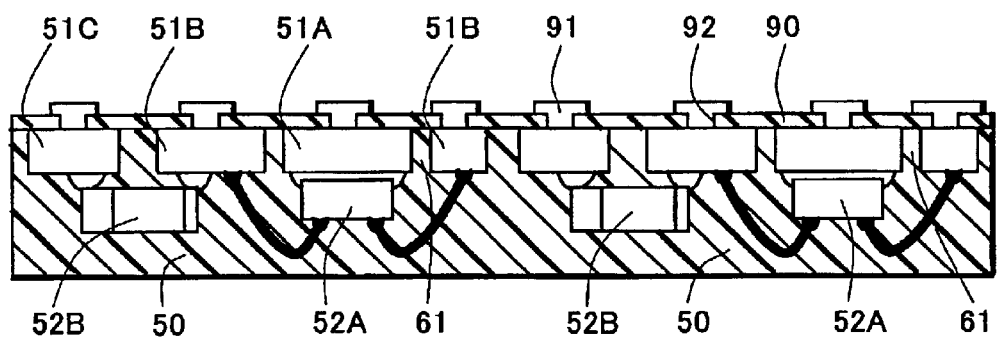
FIGS. 12A and 12B are views explaining a method of manufacturing a circuit device of the invention.
Figure 12B:
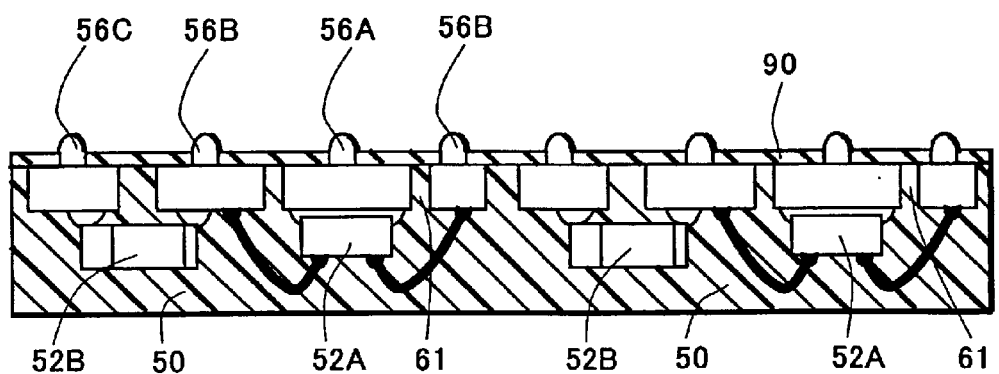

A sixth process of the invention includes the opening portion 92 and to bond a cream shaped brazing material 91 on the resist layer 90 of periphery of the opening portion in the same size similarly by screen-printing as shown in FIGS. 12A and 12B.

In the process, a solder cream in which particles of solder are mixed with organic solvent is used for the cream shaped brazing material 91. Since the cream shaped brazing material 91 is bonded largely than the opening portion 92 as shown in FIG. 12A, the brazing material is bonded to the opening portion of the entire mounting portion at every block 62 in good operation.

Further, a rear face electrode 56 is formed by letting each block 62 through heating furnace flowing nitrogen gas and heating to melt the cream shaped brazing material 91 as shown in FIG. 12B in the process. Since the cream shaped brazing material 91 same in size as the opening portion 92 is bonded previously at the rear face electrode 56, all of them are formed in uniform size.

Figure 14:
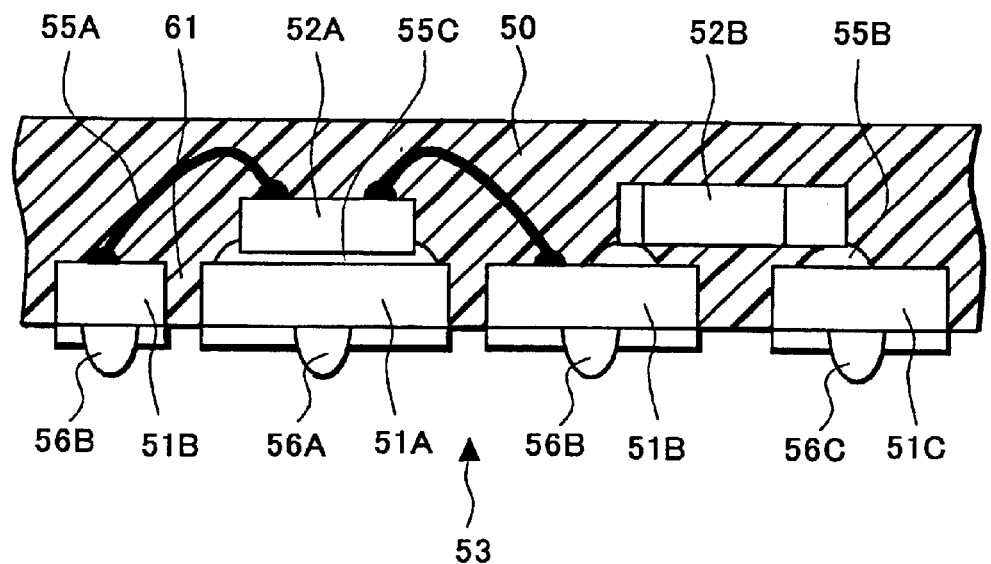
FIG. 14 is a view explaining a method of manufacturing a circuit device of the invention.

Therefore, the final structure shown in FIG. 14 is obtained after the dicing process described later. Because a difference in level is not provided like the rear face electrodes 10 and 11 of the related art shown in FIG. 19, the circuit device 53 of the invention has advantage moving horizontally to self-align as it is by surface tension of solder etc. at mounting.

Figure 13:
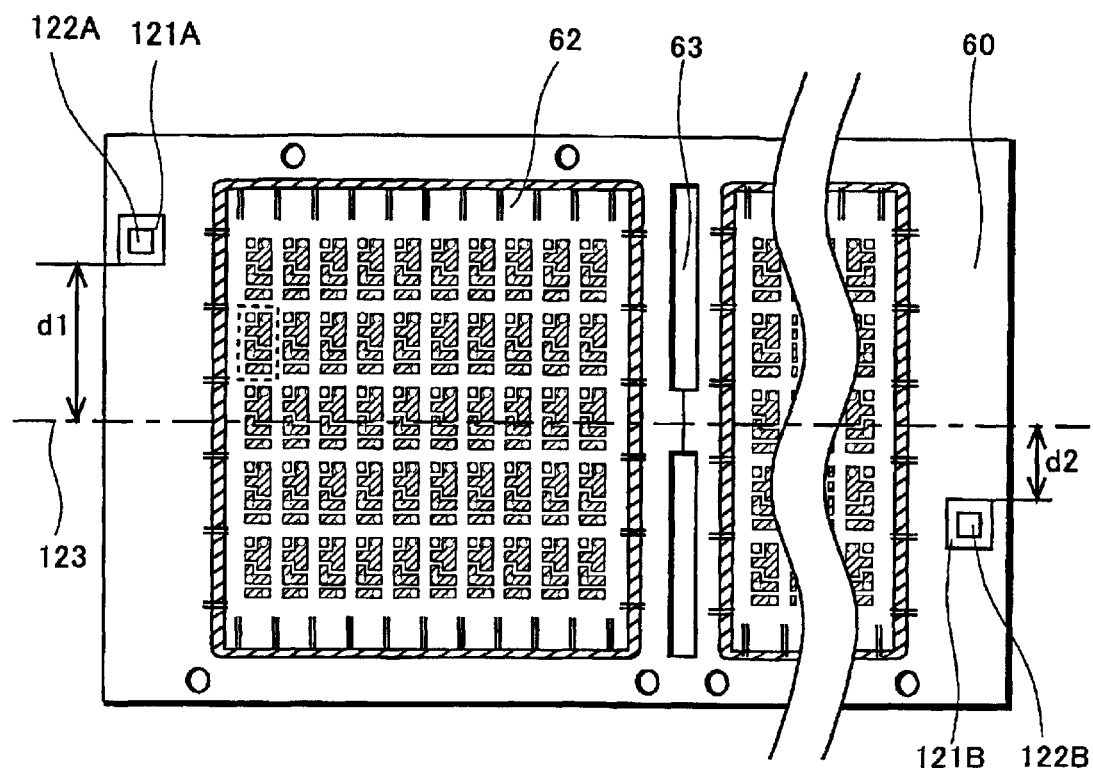
FIG. 13 is a view explaining a method of manufacturing a circuit device of the invention.

In the process, position confirmation of the opening portion of the rear resist is performed indirectly by position confirmation resists 121A and 121B having the opening portion as shown in FIG. 13.

Concretely, first position confirmation resists 121A and 121B having opening portions 122A and 122B at outside of the block of the rear face of the conductive foil at the process covering the rear face resist.

Next, the opening portions 122A and 122B of the position confirmation resists 121A and 121B are recognized by an position confirmation camera to fix the conductive foil 60.

Finally, solder printing is performed using a solder printing metal screen (not shown) having openings at the same position as the opening portions 122A and 122B of the resist.

Distances d1 and d2 from two resists 121A and 121B performing position confirmation to the center line, 123 of the conductive foil 60 are different. Therefore, in the case fixing the frame reversely at the above-mentioned process, solder printing is performed at the place far from the desired position so that judgement of bad quality at the process is performed easily.

Although the position confirmation resists are provided near both end portions of longish direction of the conductive foil 60 in the description of the process, it may be provided near end portion of shortish direction.

By the above-mentioned, solder printing using the position confirmation resist can be performed.

Figure 15:
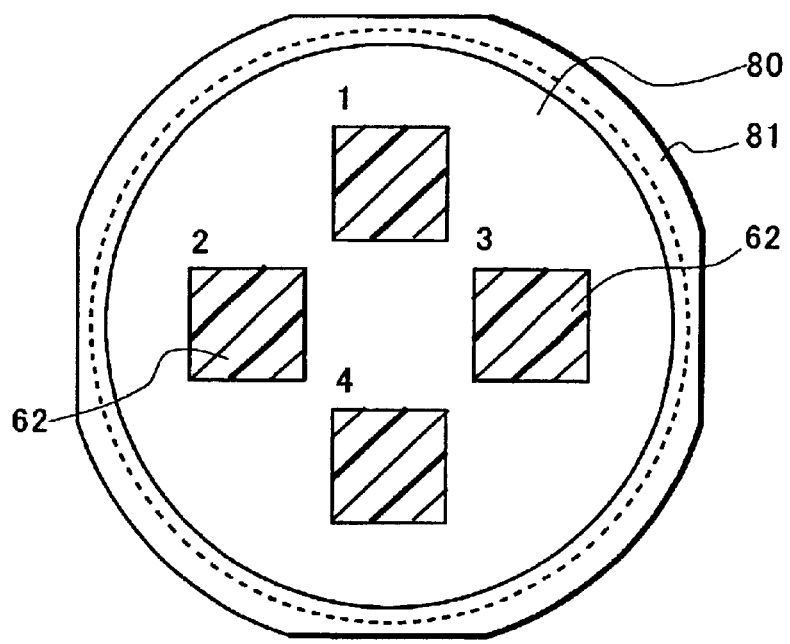
FIG. 15 is a view explaining a method of manufacturing a circuit device of the invention.

A seventh process of the invention is to bond the insulating resin of plural blocks 62 to an adhesive sheet 80 as shown in FIG. 15.

Each block 62 is cut off from the conductive foil 60 after etching the rear face of the conductive foil 60. Since the block 62 is connected to the remained portion of the conductive foil 60 with the insulating resin 50, the separated block is obtained by pealing off from the remained portion of the conductive foil 60 mechanically without using cutting die.

In the process, periphery of the adhesive sheet 80 is bonded at ring shaped metal frame 81 made of stainless, and four blocks 62 are bonded at center part of the adhesive sheet 80 providing space that a blade at dicing does not touch by contacting the insulation resin 50. Although UV sheet is used for the adhesive sheet 80, also reasonable dicing sheet can be used since each block 62 has mechanical strength because of the insulating resin 50.

Figure 16:
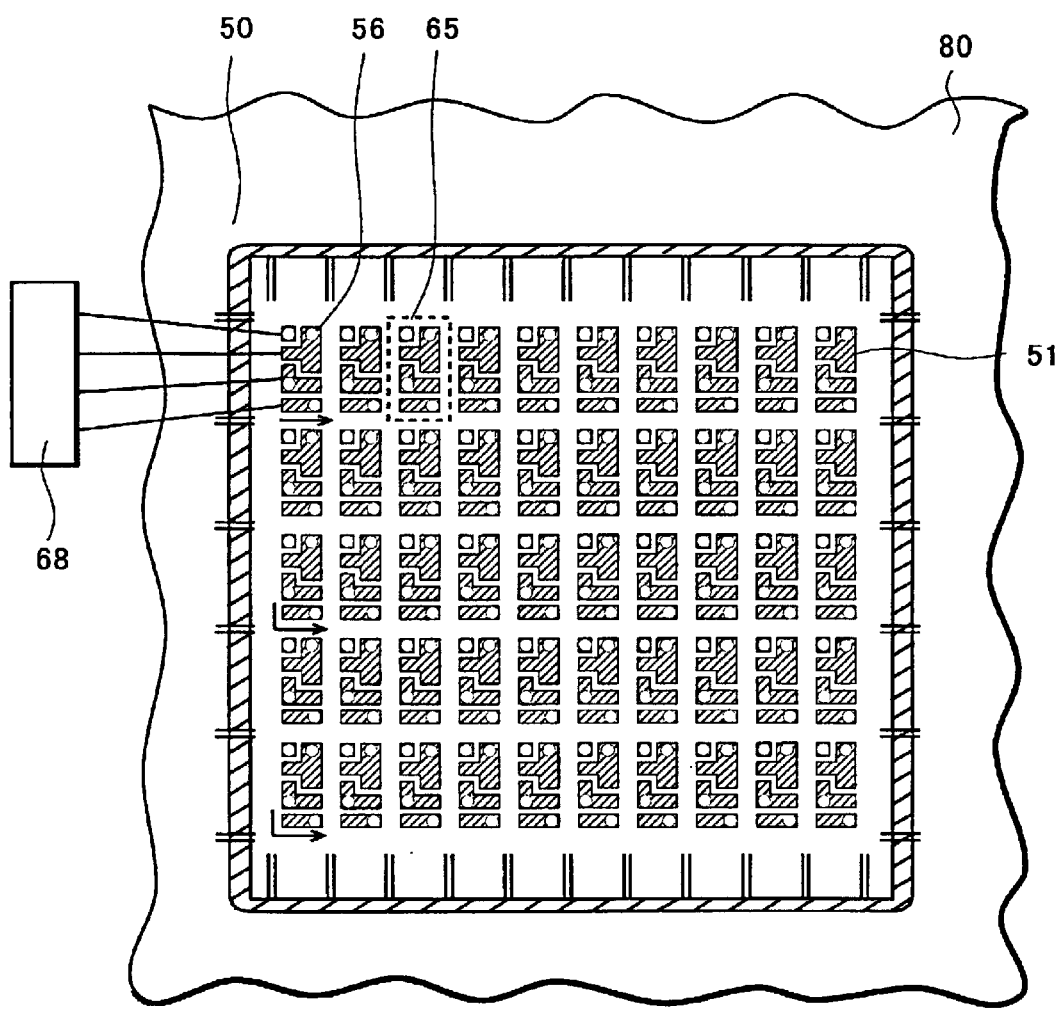
FIG. 16 is a view explaining a method of manufacturing a circuit device of the invention.

An eighth process of the invention is to perform test of property of the circuit device 52 of each mounting portion 65 of each block 62 molded with the insulating resin 50 in a lump at the state bonded on the adhesive sheet 80 as shown in FIG. 16.

The rear face electrodes 56 of the conductive pattern 51 are exposed at the rear face of each block 62, and each mounting portion 65 is arranged in matrix shape in the entirely same way as forming the conductive pattern 51 as shown in FIG. 16. Applying a probe 68 to the rear face electrode 56 exposed from the insulating resin 50 of the conductive pattern 51, judgement of good quality or not is performed by testing characteristic parameter and the like of the circuit device 52 on each mounting portion 65, and marking is performed for bad quality with magnetic ink and the like.

Although hatched parts show the conductive patterns 51 and outline circles on a hatched background show the rear face electrodes 56 to show relation between the rear face electrode 56 and the conductive pattern 51 in FIG. 16, actually the conductive pattern 51 except the opening portion 92 is covered by the resist layer 90.

In the process, since the circuit device 53 of each mounting portion 65 is supported by the insulating resin 50 in one body at every block 62, it is not separated individually disconnectedly. Therefore, by absorbing plural blocks 62 bonded at the adhesive sheet 80 on a mounting table of the tester by vacuum and by pitch-feeding it for size of the mounting portion 65 at every block 62 to longitudinal direction and lateral direction like as arrow sign, test of large quantity of the circuit devices 53 of each mounting portion 65 of the block 62 is performed very rapidly. That is, judgement of two-faces and recognition of position of electrode of the circuit device needing in the related art becomes needless so as to design sharp shortening of testing time.

Although test of the property is performed before separating to individual circuit device by dicing in the process, it is possible to perform test of the property after dicing as the circuit device is in the state bonded at the sheet even when dicing is performed in the invention.

Figure 17:
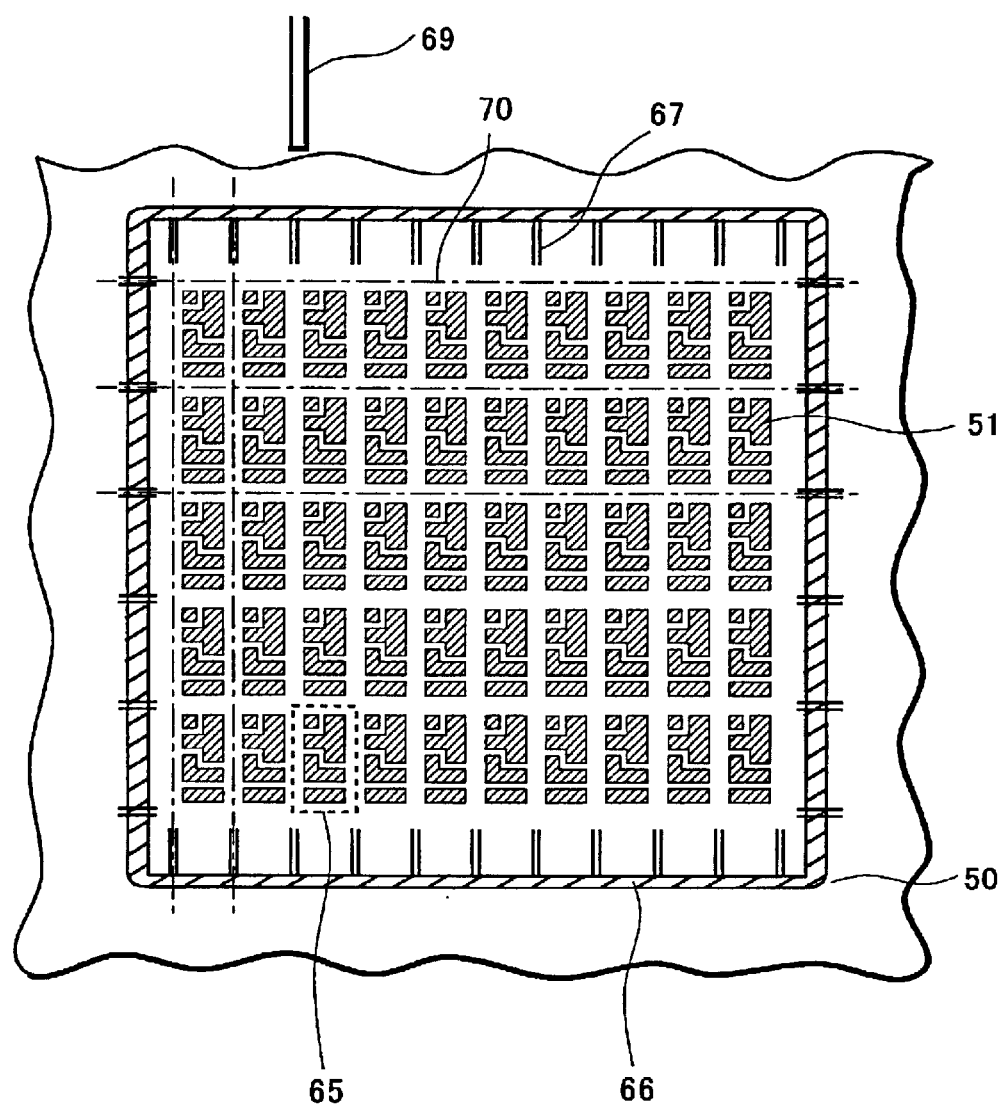
FIG. 17 is a view explaining a method of manufacturing a circuit device of the invention.
Figure 18:
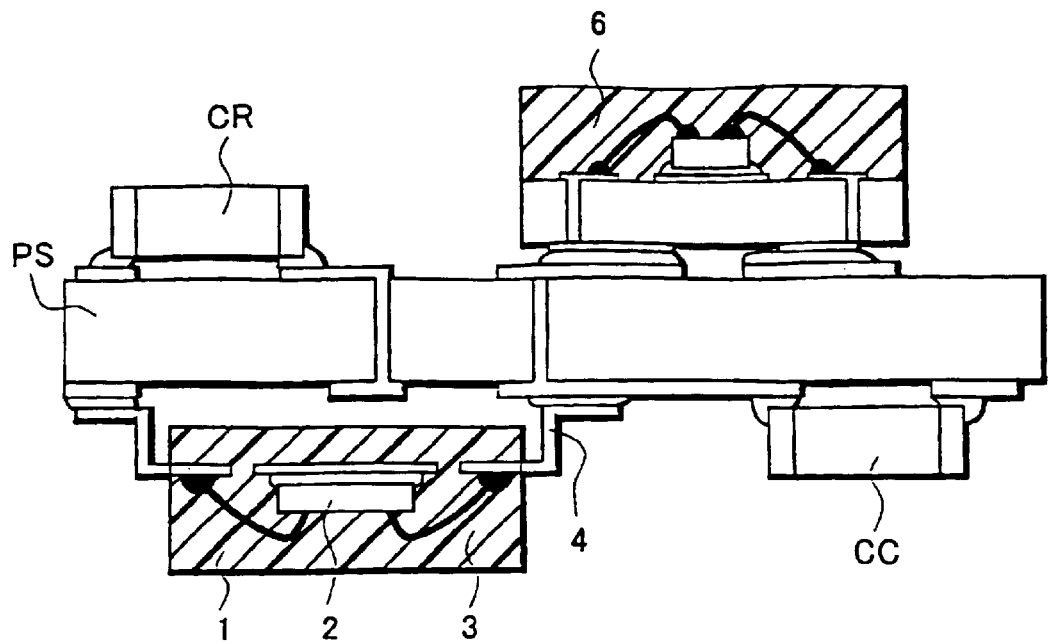
FIG. 18 is a view explaining the mounting structure of the conventional circuit device.

A ninth process of the invention is to separate the insulating resin 50 of the block 62 at every mounting portion 65 by dicing in the state bonded at the adhesive sheet 80 as shown in FIG. 17.

In the process, plural blocks 62 bonded at the adhesive sheet 80 are absorbed on the mounting table of the dicing device by vacuum, and the insulating resin 50 of the isolation trench 61 is diced along the dicing line 70 between each mounting portions 65 by a dicing blade 69 so as to separate to individual circuit device 53.

In the process, the dicing blade 69 cuts off the insulating resin 50 entirely and dices with cutting depth reaching surface of the adhesive sheet so as to separate entirely at every mounting portion 65. A positioning mark 67 of inside of frame shaped pattern 66 at periphery of each block provided at the above-mentioned first process is recognized previously at dicing, dicing is performed making the recognition standard. Dicing of lateral direction is performed letting the mounting table rotate 90 degrees after dicing all to longitudinal direction though it is well known.

In the process, since there are only the insulating resin 50 filled in the isolation trench 61 and the resist layer 90 in the dicing line, abrasion of the dicing blade 69 is a few and metal burr does not generate so as to have advantage dicing in accurate external form.

Further after the process, the circuit devices are not separated individually by action of the adhesive sheet 80 even after dicing, and efficient operation is performed even at the later taping process. That is, only good quality of the circuit device supported in one body at the adhesive sheet 80 is distinguished and is stored at a storing hole of a tape carrier separating from the adhesive sheet 80 by absorbing collet. Because of that, even small circuit device is not separated apart until taping process once.

In the invention, the conductive foil itself being conductive pattern material is functioned as a supporting substrate, whole structure is supported by the conductive foil until forming the isolation trench, mounting the circuit element, and covering the insulating resin, and when the conductive foil is separated as each conductive pattern, the insulating resin is functioned as a supported substrate. Therefore, the circuit device can be produced by the minimum of the circuit element, the conductive foil, and the insulating resin required. The supporting substrate at constructing the circuit device originally is needless as described in the example of the related art so as to become low in cost. By that the supporting substrate is needless, the conductive pattern is buried in the insulating resin, and further adjustment of thickness the insulating resin and the conductive foil is possible, there is a merit forming a very thin circuit device.

Further in the invention, since the guide hole is etched at the process removing the rear face Cu foil, accuracy of size and position of the guide hole is low, and it is difficult to use the guide hole as a positioning mark at the covering process of the rear face resist. Then, a confirmation hole is formed at the half-etching process, the insulating resin is enclosed in the confirmation hole at the molding process, and the insulating resin exposed at the rear face of the Cu foil is adopted as a positioning mark at the removing process of the rear face Cu foil in the invention. Therefore, it is possible to form the positioning mark at the predetermined position with the predetermined size.

By that, in the invention, position recognition of the conductive pattern exposed at the rear face is performed indirectly at every block or every conductive foil by position-recognizing the above-mentioned positioning mark. The resist layer can be formed except the opening portion forming the scheduled rear face electrode on the conductive pattern at every block or every conductive foil by one position recognition. Therefore, a method of manufacturing shortened in time can be realized.

There is a method using a conductive foil exposed at the rear face of the insulating resin at inside of the block as a positioning mark. Further, there is a method using a conductive foil exposed at inside of the conductive foil exposed at the rear face of the insulating resin at inside of the block as a positioning mark. By these two methods, the same advantage as the above-mentioned advantage is obtained.

What is claimed is:

1. A method of manufacturing a circuit device comprising:

preparing a conductive foil having an isolation trench at an area except where a conductive pattern is to be formed;

fixing circuit elements at mounting portions of said conductive pattern;

electrically connecting an electrode of the circuit element and said conductive pattern;

commonly molding to cover said circuit elements fixed on the mounting portions in a lump with an insulation resin and to fill the insulation resin into said isolation trench; and removing the entire rear face of said conductive foil until said insulating resin is exposed, wherein the position of said conductive pattern exposed at the rear face is confirmed by using, as a positioning mark, said insulating resin exposed at the rear face of said conductive foil in the step of removing the rear face of said conductive foil.

2. The method of manufacturing a circuit device as claimed in claim 1, wherein the position of said conductive pattern of the rear face is recognized indirectly by the positioning mark, and a resist layer is covered except an opening portion for an area where a rear face electrode is to be formed on said conductive pattern.

3. The method of manufacturing a circuit device as claimed in claim 2, wherein a rear face electrode is formed by a conductive member provided at the opening portion of said resist layer.

4. The method of manufacturing a circuit device as claimed in claim 1, wherein the position of said conductive pattern of the rear face is recognized indirectly by said positioning mark, and dicing is performed.

5. The method of manufacturing a circuit device as claimed in claim 1, wherein the position of the electrode of the rear face is recognized indirectly by said positioning mark, and the property of said circuit elements is tested.

6. The method of manufacturing a circuit device as claimed in claim 1, wherein the positioning mark is formed at outside of a block on which said circuit elements are formed on said conductive foil.

7. The method of manufacturing a circuit device as claimed in claim 1, wherein the positioning mark is provided at periphery of said conductive foil.

8. The method of manufacturing a circuit device according to claim 1, wherein the position of said conductive pattern exposed at the rear face of said insulating resin of a block on which said circuit elements are formed on said conductive foil is confirmed by said positioning mark.

9. The method of manufacturing a circuit device as claimed in claim 1, wherein the position of said conductive pattern exposed at the rear face of said insulating resin of the whole of said conductive foil is confirmed by said positioning mark.

10. The method of manufacturing a circuit device as claimed in claim 1, wherein said insulating resin is common-molded by transfer molding at each of block on which at least said circuit elements are formed on said conductive foil.

11. The method of manufacturing a circuit device as claimed in claim 1, wherein plural blocks including conductive patterns forming mounting portions for at least plural circuit elements in matrix shape are lined on said conductive foil.

12. The method of manufacturing a circuit device according to claim 11, wherein said insulating resin is formed by transfer-molding each of said blocks and all the blocks are transfer-molded at the same time.

13. The method of manufacturing a circuit device as claimed in claim 1, further comprising:
    forming a confirmation hole in said conductive foil at the time of forming said isolation trench; and
    filling the insulation resin into said confirmation hole concomitant with filling the insulation resin into said isolation trench.

14. The method of manufacturing a circuit device as claimed in claim 13, wherein said insulating resin exposed at said confirmation hole in the rear face of said conductive foil is used as the positioning mark.

15. The method of manufacturing a circuit device as claimed in claim 13, wherein said isolation trench and said confirmation hole are removed chemically or physically.

16. A method of manufacturing a circuit device comprising:
    preparing a conductive foil;
    providing an isolation trench being shallower than the thickness of said conductive foil at an area except where a conductive pattern is to be formed;
    fixing circuit elements at mounting portions of said conductive pattern;
    electrically connecting an electrode of the circuit elements and said conductive pattern;
    commonly molding to cover said circuit elements fixed on the mounting portions in a lump with an insulation resin and to fill the insulation resin into said isolation trench; and
    removing the entire rear face of said conductive foil until said insulating resin is exposed,
    wherein the position of said conductive pattern exposed at the rear face is confirmed by using, as a positioning mark, at least one of rear faces of said conductive foil surrounded by the exposed insulation resin while removing the rear face of said conductive foil.

17. The method of manufacturing a circuit device as claimed in claim 15, wherein the position of said conductive pattern of the rear face is recognized indirectly by the positioning mark, and a resist layer is covered except an opening portion for an area where a rear face electrode is to be formed on said conductive pattern.

18. The method of manufacturing a circuit device as claimed in claim 17, wherein a rear face electrode is formed by a conductive member provided at the opening portion of said resist layer.

19. The method of manufacturing a circuit device as claimed in claim 16, wherein the position of said conductive pattern of the rear face is recognized indirectly by said positioning mark, and dicing is performed.

20. The method of manufacturing a circuit device as claimed in claim 16, wherein the position of the electrode of the rear face is recognized indirectly by said positioning mark, and the property of said circuit elements is tested.

21. The method of manufacturing a circuit device as claimed in claim 16, wherein the positioning mark is formed at outside of a block on which said circuit elements are formed on said conductive foil.

22. The method of manufacturing a circuit device as claimed in claim 16, wherein the positioning mark is provided at periphery of said conductive foil.

23. The method of manufacturing a circuit device according to claim 16, wherein the position of said conductive pattern exposed at the rear face of said insulating resin of a block on which said circuit elements are formed on said conductive foil is confirmed by said positioning mark.

24. The method of manufacturing a circuit device as claimed in claim 16, wherein the position of said conductive pattern exposed at the rear face of said insulating resin of the whole of said conductive foil is confirmed by said positioning mark.

25. The method of manufacturing a circuit device as claimed in claim 16, wherein said insulating resin is common-molded by transfer molding at each of block on which at least said circuit elements are formed on said conductive foil.

26. The method of manufacturing a circuit device as claimed in claim 16, wherein plural blocks including conductive patterns forming mounting portions for at least plural circuit elements in matrix shape are lined on said conductive foil.

27. The method of manufacturing a circuit device according to claim 26, wherein said insulating resin is formed by transfer-molding each of said blocks and all the blocks are transfer-molded at the same time.

28. The method of manufacturing a circuit device as claimed in claim 16, further comprising:
    forming a positioning trench at said conductive foil to surround a portion where the positioning mark is to be formed, at the time of forming said isolation trench; and
    filling the insulation resin into said positioning trench concomitant with filling the insulation resin into said isolation trench,
    wherein a rear face of said conductive foil at the portion surrounded by the insulation resin filled in the positioning trench is used as the positioning mark.

29. The method of manufacturing a circuit device as claimed in claim 28, wherein said isolation trench and said positioning trench are removed chemically or physically.

30. A method of manufacturing a circuit device comprising:
    preparing a conductive foil;
    providing an isolation trench being shallower than the thickness of said conductive foil at an area except where a conductive pattern is to be formed;
    fixing circuit elements at mounting portions of said conductive pattern;
    electrically connecting an electrode of the circuit elements and said conductive pattern;
    commonly molding to cover said circuit elements fixed on the mounting portions in a lump with an insulation resin and to fill the insulation resin into said isolation trench;
    removing the rear face of said conductive foil until said insulating resin is exposed; and
    recognizing the position of said conductive pattern exposed at the rear face by using different reflectance between said insulating resin and said conductive foil.

31. A method of manufacturing a circuit device comprising:

preparing a conductive foil having an isolation trench at an area except where a conductive pattern is to be formed;

electrically connecting an electrode of circuit elements and said conductive pattern;

commonly molding to cover said circuit elements fixed on mounting portions of said conductive pattern in a lump with an insulation resin and to fill the insulation resin into said isolation trench; and removing the rear face of said conductive foil until said insulating resin is exposed, wherein the position of said conductive pattern exposed at the rear face is confirmed by using, as a position mark, said insulating resin exposed at the rear face of said conductive foil in the step of removing the rear face of said conductive foil.

* * * * *